United States Patent [19]

Hillman et al.

[11] Patent Number: 5,451,258
[45] Date of Patent: Sep. 19, 1995

[54] APPARATUS AND METHOD FOR IMPROVED DELIVERY OF VAPORIZED REACTANT GASES TO A REACTION CHAMBER

[75] Inventors: Joseph T. Hillman, Scottsdale; W. Chuck Ramsey, Chandler, both of Ariz.

[73] Assignee: Materials Research Corporation, Orangeburg, N.Y.

[21] Appl. No.: 241,184
[22] Filed: May 11, 1994
[51] Int. Cl.6 ............................................. C23C 16/00
[52] U.S. Cl. ..................... 118/715; 118/724; 118/726
[58] Field of Search ................... 118/715, 726, 724

[56] References Cited

U.S. PATENT DOCUMENTS

| | | | |
|---|---|---|---|
| 3,666,553 | 5/1972 | Arthur et al. | 427/248.1 |
| 4,031,851 | 6/1977 | Camahort | 118/49.1 |
| 4,089,207 | 5/1978 | Patton | 73/23.1 |
| 4,123,034 | 11/1978 | Horner | 29/157.3 |
| 4,152,478 | 5/1979 | Takagi | 427/248.1 |
| 4,167,915 | 9/1979 | Toole et al. | 118/692 |
| 4,200,784 | 4/1980 | Albaric et al. | 219/470 |
| 4,213,034 | 7/1980 | Goss et al. | 219/535 |
| 4,220,460 | 9/1980 | Partus | 65/3 A |
| 4,256,052 | 3/1981 | Johnson et al. | 118/719 |
| 4,276,243 | 6/1981 | Partus | 219/128 |
| 4,351,805 | 9/1982 | Reisman et al. | 422/202 |
| 4,395,440 | 7/1983 | Abe et al. | 118/719 |
| 4,436,674 | 3/1984 | McMenamin | 261/64 B |
| 4,438,153 | 3/1984 | Pinhasov | 118/726 |
| 4,468,283 | 8/1984 | Ahmed | 156/642 |
| 4,484,576 | 11/1984 | Albarda | 128/202 |
| 4,484,943 | 11/1984 | Miura et al. | 118/726 |
| 4,488,506 | 12/1984 | Heinecke et al. | 118/667 |
| 4,516,527 | 5/1985 | Sugioka | 118/726 |
| 4,545,801 | 10/1985 | Miyajiri et al. | 65/157 |
| 4,582,480 | 4/1986 | Lynch et al. | 432/1 |
| 4,619,844 | 10/1986 | Pierce et al. | 427/248.1 |
| 4,625,678 | 12/1986 | Shioya et al. | 118/723 |
| 4,699,082 | 10/1987 | Hakim | 118/716 |
| 4,704,988 | 11/1987 | Mellet | 118/726 |
| 4,717,596 | 1/1988 | Barbee et al. | 427/248.1 |
| 4,844,006 | 7/1989 | Page, Jr. et al. | 118/719 |
| 4,856,457 | 8/1989 | Knauer | 118/666 |
| 4,911,812 | 3/1990 | Kudo | 118/724 |
| 4,971,100 | 11/1990 | Ohmi | 137/334 |
| 5,035,767 | 7/1991 | Nishizawa | 156/613 |
| 5,058,616 | 10/1991 | Ohmi | 137/13 |
| 5,074,954 | 12/1991 | Nishizawa | 156/610 |
| 5,091,207 | 2/1992 | Tanaka | 427/8 |
| 5,146,869 | 9/1992 | Bohannon et al. | 118/724 |
| 5,160,542 | 11/1992 | Mihira et al. | 118/715 |
| 5,186,120 | 2/1993 | Ohnishi et al. | 118/667 |
| 5,252,134 | 10/1993 | Stauffer | 118/726 |
| 5,269,847 | 12/1993 | Anderson | 118/715 |
| 5,278,940 | 1/1994 | Muller | 392/485 |

FOREIGN PATENT DOCUMENTS

| | | |
|---|---|---|
| 0419939 | 4/1991 | European Pat. Off. . |
| 0506012 | 9/1992 | European Pat. Off. . |
| 57-47738 | 3/1982 | Japan . |
| 9221789 | 12/1992 | WIPO ................. 118/726 |

OTHER PUBLICATIONS

Mass Flow Measurement and Control of Low Vapor Pressure Sources, Sullivan, Schaffer, Jacobs, Journal of Vacuum Science and Technology (1989) May/Jun.

Primary Examiner—R. Bruce Breneman
Assistant Examiner—Jeffrie R. Lund
Attorney, Agent, or Firm—Wood, Herron & Evans

[57] ABSTRACT

Gas delivery apparatuses and methods utilize a housing containing three thermal zones through which a gas travels from a source to a reaction chamber. Reactant gases vaporized within the first thermal zone travel in a line through the succeeding thermal zones. In each successive thermal zone, the gas is heated at a higher temperature to prevent condensation within the line. The gas line is heated in the thermal zones by mounting in-line components to heater plates which are controlled to heat the in-line components at the temperatures associated with the thermal zone. The third thermal zone is heated at a substantially higher temperature than the first and second thermal zones in order to prevent formation of an adduct within the gas line. In one embodiment, the gas line extends into the reaction chamber through a heater block which uniformly heats the gas line at a temperature higher than temperatures of the thermal zones to further prevent condensation and prevent the formation of an adduct. In an alternative embodiment, a gas passage is integrally formed within the sidewall and cover of the reaction chamber.

37 Claims, 5 Drawing Sheets

APPARATUS AND METHOD FOR IMPROVED DELIVERY OF VAPORIZED REACTANT GASES TO A REACTION CHAMBER

FIELD OF THE INVENTION

This invention relates generally to systems for delivering reactant gases to a reaction chamber and specifically to an improved, reliable gas delivery system for delivering $TiCl_4$ gas to a reaction chamber for CVD processes.

BACKGROUND OF THE INVENTION

Chemical vapor deposition techniques utilize a variety of different reactant gases. The gases are brought together inside of a reaction chamber in the presence of a substrate, and the gases react and deposit a film on the surface of the substrate. Some of the gases utilized for CVD techniques originate as liquids and must be evaporated and transported in their gaseous state to the reaction chamber. The gas delivery systems and lines for transporting the necessary reactant gases to the reaction chamber are heated to prevent condensation of the gas in the lines.

As one example, titanium tetrachloride ($TiCl_4$) is utilized as a reactant gas in chemical vapor deposition reactions to deposit titanium-containing film layers onto the surface of a substrate. A source of titanium tetrachloride in liquid form is heated to provide a vapor pressure in a system containing a gas delivery line and the pressure drives the gas through the gas delivery line. A mass flow controller controls the rate of gas flow at a level appropriate for the vapor deposition reaction. Mass flow controllers control and measure the amount of gas delivered through the system typically in standard cubic centimeters per minute (sccm). To provide a $TiCl_4$ delivery pressure of approximately 100 Torr in a typical reactant gas delivery systems, a liquid source of $TiCl_4$ is heated to around 70° C. To maintain the pressure and prevent condensation, the gas delivery lines and any in-line components, such as valves and connectors, must be kept above 70° C. However, the maximum operating temperature for commercially available mass flow controllers is around 90° C. Therefore, while the gas delivery lines and components must be maintained at a minimum temperature, that temperature cannot exceed a predetermined maximum due to the constraints of the mass flow controller.

Traditionally, heating the gas delivery lines in a CVD reactant gas system has involved wrapping the lines and any other in-line gas components, such as the mass flow controller, with heater tape. Heater tape incorporates an electrically-powered resistive heating element which generates heat and conductively transfers it to the gas delivery line and components. A drawback of heater tape, however, is that the wrapping process is very tedious and often sloppy due to the various sizes and shapes of the components which must be heated. Further, the discontinuous connections between the gas line and in-line components hinders sufficient coverage of the system. The sloppiness of the wrapping procedure and the non-uniform shape of the resulting heater tape creates temperature non-uniformity throughout the heated line. Additionally, the different masses and heat absorption characteristics of the components further hinders temperature uniformity. The result is condensation of $TiCl_4$ in the line, which leads to undesirable deposition process variability, and may ultimately lead to failure of the in-line components, such as, the mass flow controller.

Additional heating difficulties result when heater tape is used because of the structure of the line connected between the mass flow controller and the reaction chamber. Traditional gas delivery lines have included a flexible line portion leading into the reaction chamber so that the chamber cover may be lifted away from the chamber. The flexibility of the flexible line portion causes the heater tape to shift when the portion flexes, further contributing to poor temperature uniformity.

Still further, prior art gas delivery systems have not addressed the problem of chemical reaction within the gas line itself. Specifically, ammonia gas ($NH_3$) is often utilized with $TiCl_4$ to deposit titanium-containing films by CVD processes. Depending upon the process parameters, an amount of the ammonia gas introduced into the reaction chamber may be drawn back into the $TiCl_4$ delivery line. The reaction product of $NH_3$ and $TiCl_4$ is a yellow, powdery adduct. The adduct forms within the line and coats the walls of the line, ultimately interrupting the flow of $TiCl_4$ and also producing contaminants within the line and the reaction chamber. Generally, prior art gas delivery systems do not adequately address such adduct formation, and therefore require costly and time-consuming steps such as regular cleaning of the gas delivery line.

Accordingly, it is an objective of the present invention to provide an improved reactant gas delivery system which eliminates the drawbacks of prior art systems. Specifically, it is an objective of the present invention to provide uniform heating of the reactant gas line and reactant gas while eliminating the heating drawbacks of various prior art systems, such as those utilizing heater tape. Further, it is an objective of the present invention to ensure temperature uniformity in the entire gas delivery line from the source to the reaction chamber to prevent condensation. It is further an objective to provide temperature uniformity while preventing damage to the mass flow controller and any other temperature sensitive components connected in-line in the gas delivery system. It is still further an objective of the present invention to adequately prevent formation of an adduct or other reaction product within the gas delivery line.

SUMMARY OF THE INVENTION

The gas delivery apparatuses and methods of the present invention provide excellent temperature uniformity of the gas line and reactant gas while insuring proper operation of the in-line components and prevention of condensation in the gas line. The present invention further prevents formation of unwanted adducts within the gas line. The invention includes a thermally insulated heater housing separated into three thermal zones. A gas delivery line extends from the gas source and through the housing and thermal zones. The heater housing, and specifically the thermal zones, operate to heat the source and gas line extending therethrough at progressively higher temperatures to produce temperature uniformity of the gas line and reactant gas and prevent condensation in the line. The thermal zones are insulated from each other by housing walls. The gas delivery lines and associated plumbing components are dimensioned to have a relatively large diameter in order to minimize the pressure drop through the system.

The first thermal zone contains the gas source, such as an ampule of liquified titanium tetrachloride (TiCl$_4$). The ampule is heated until the liquified TiCl$_4$ or other chemical vaporizes to produce the reactant gas in the gas line. The temperature of the first thermal zone is dependent upon the vaporization point of the reactant chemical and the desired source pressure, as higher temperatures yield higher reactant gas pressures in the system. The first thermal zone includes a spring-loaded aluminum plate heater on which the ampule is supported. The plate heater is biased against the bottom of the ampule to conductively and uniformly heat the ampule. The plate heater is operated to heat the ampule at a first predetermined temperature. For delivery of vaporized TiCl$_4$, a temperature of around 70° C. evaporates the TiCl$_4$ and produces reactant gas in the gas line.

A second thermal zone, above the first thermal zone, heats the gas line to a second temperature higher than the first zone temperature. The section of gas delivery line extending through the second thermal zone generally includes various in-line valves, connectors and usually the mass flow controller for the system. In the second thermal zone of the invention, the in-line valves, connectors, and the mass flow controller are secured to mounting plates which, in turn, are mounted to a generally flat aluminum plate heater. When the mounting plates are mounted to the plate heater, the heater uniformly, conductively heats the in-line components through the mounting plates to produce uniform heating of the reactant gas throughout the second thermal zone. The second thermal zone heater base is heated to a higher temperature than the first thermal zone plate heater to prevent any cool spots in the reactant gas line which might produce condensation. Simultaneously, the second thermal zone is maintained at a temperature which will not damage temperature sensitive in-line components, and specifically the mass flow controller. In a preferred embodiment of the system for TiCl$_4$ delivery, the plate heater of the second thermal zone is heated to approximately 80° C.

A third thermal zone heats the gas to a third temperature higher than the temperatures of the first and second thermal zones. The in-line components in the third thermal zone of the housing are secured to mounting plates which are mounted to a plate heater. The gas line components in the third thermal zone are heated to a temperature higher than the temperature of the first and second thermal zones. While the third thermal zone and associated temperature prevent condensation in the line, the third temperature is substantially hotter than the temperatures of the upstream zones to also prevent formation of contaminant adducts in the line.

The gas delivery line extends out of the housing into the reaction chamber and the reactant gas is delivered to the reaction chamber at a uniform flow rate at the desired delivery pressure. In one embodiment of the present invention, the section of gas line extending between the housing and the reaction chamber is rigid rather than a flexible line which has been traditionally utilized. The rigid section extends through an elongated, rigid heater block which is uniformly heated along its length to provide uniform heating along the length of the rigid line section. Further, the rigid heater block and line section eliminates the problematic flexing of the line which produces nonuniform heating and condensation in the line. The temperature of the heating block is maintained generally higher than the temperature of the thermal zones in the heater housing, preferably around 175° C., to further prevent condensation in the line and to assist in the prevention of reactant adduct formation in the line.

An alternative embodiment of the present invention eliminates the rigid section of connecting pipe and the heat block. Instead, an integral gas passage is formed within a reaction chamber wall and the reaction chamber cover. The gas line is brought out of the housing and is coupled directly to a gas passage formed within the chamber wall. When the cover is on the reaction chamber, a passage in the cover is coupled with the wall passage to form a continuous gas passage through the chamber wall and cover and into the reaction chamber. The cover and wall proximate the gas passage are heated to preferably 175° C. using heating units such as cartridge heaters which are positioned within the wall and cover. The alternative embodiment eliminates the use of the elongated heater block and the necessity of disconnecting and re-connecting the block from the housing whenever the cover is removed from the reaction chamber. The alternative embodiment further eliminates temperature uniformity problems associated with a flexing gas line between the gas source and the reaction chamber.

Accordingly, the present invention provides uniform heating of the reactant gas line from the source to the reaction chamber. Temperature measurements of the line utilizing the present invention have shown a temperature gradient along the gas line in the direction of the gas flow of less than 1° C. in each zone. Further, the present invention prevents condensation in the line and thereby eliminates process variability and in-line component failure. Still further, contaminating adducts are prevented within the delivery line. These and other beneficial features of the present invention will become more evident from the detailed description and drawings discussed hereinbelow.

DETAILED DESCRIPTION OF THE INVENTION

The gas delivery system of the present invention provides uniform heating of the gas delivery line and the reactant gas from the source to the reaction chamber. It prevents condensation in the line and further prevents the formation of undesirable adducts in the line section adjacent the reaction chamber. The system was developed specifically for vaporization and delivery of titanium tetrachloride (TiCl$_4$) to a reaction chamber; however, its benefits extend to the vaporization and delivery of other reactant gases. Therefore, while a preferred embodiment of the present invention will be described with respect to the delivery of vaporized TiCl$_4$, it should be understood that the utility of the system as modified by a person of ordinary skill in the art extends beyond delivery of TlCl$_4$.

Figure 1:
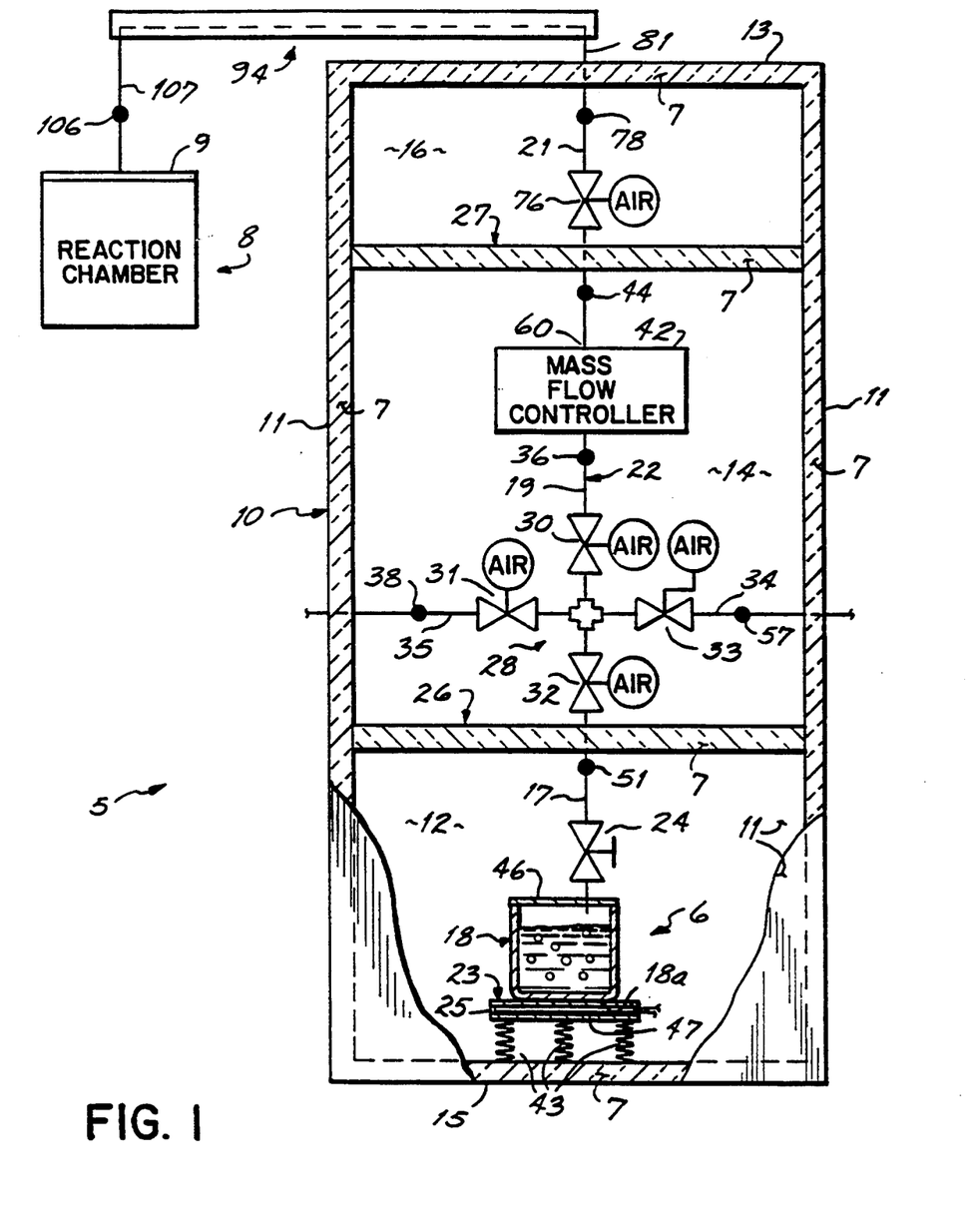
FIG. 1 is a schematic view of the reactant gas delivery system of the present invention.

Referring to FIG. 1, a schematic diagram of the gas delivery system 5 of the present invention is shown including a source 6 of liquid reactant material, such as TiCl$_4$, and a reaction chamber 8 with a chamber cover 9. The system 5 comprises a housing 10 which is preferably made of 16 gauge stainless steel. Housing 10 extends generally vertically to define three thermal zones 12, 14, 16 one stacked vertically on top of another. The walls of housing 10 are insulated throughout by foam insulation 7 such as Techlight Foam available from Accessible Products of Phoenix, Ariz. The insulation 7 lines the side walls 11, top wall 13 and bottom wall 15 of housing 10 and has a layer of reflective mylar (not shown) which faces inwardly of the housing 10. Thermal zones 12, 14 and 16 are separated within housing 10 by walls 26 and 27 also preferably made of 16 gauge stainless steel and lined with similar insulation as the housing 10. A gas delivery line 22 extends from source 6 through housing 10 and thermal zones 12, 14, 16 and connects to reaction chamber 8 to deliver reactant gas for a CVD process. The gas delivery line preferably has an outer diameter of approximately 0.5 inches and an inner diameter of approximately 0.4 inches. The delivery line comprises various sections 17, 19, 21 which extend through thermal zones 12, 14 and 16, respectively.

Figure 2A:
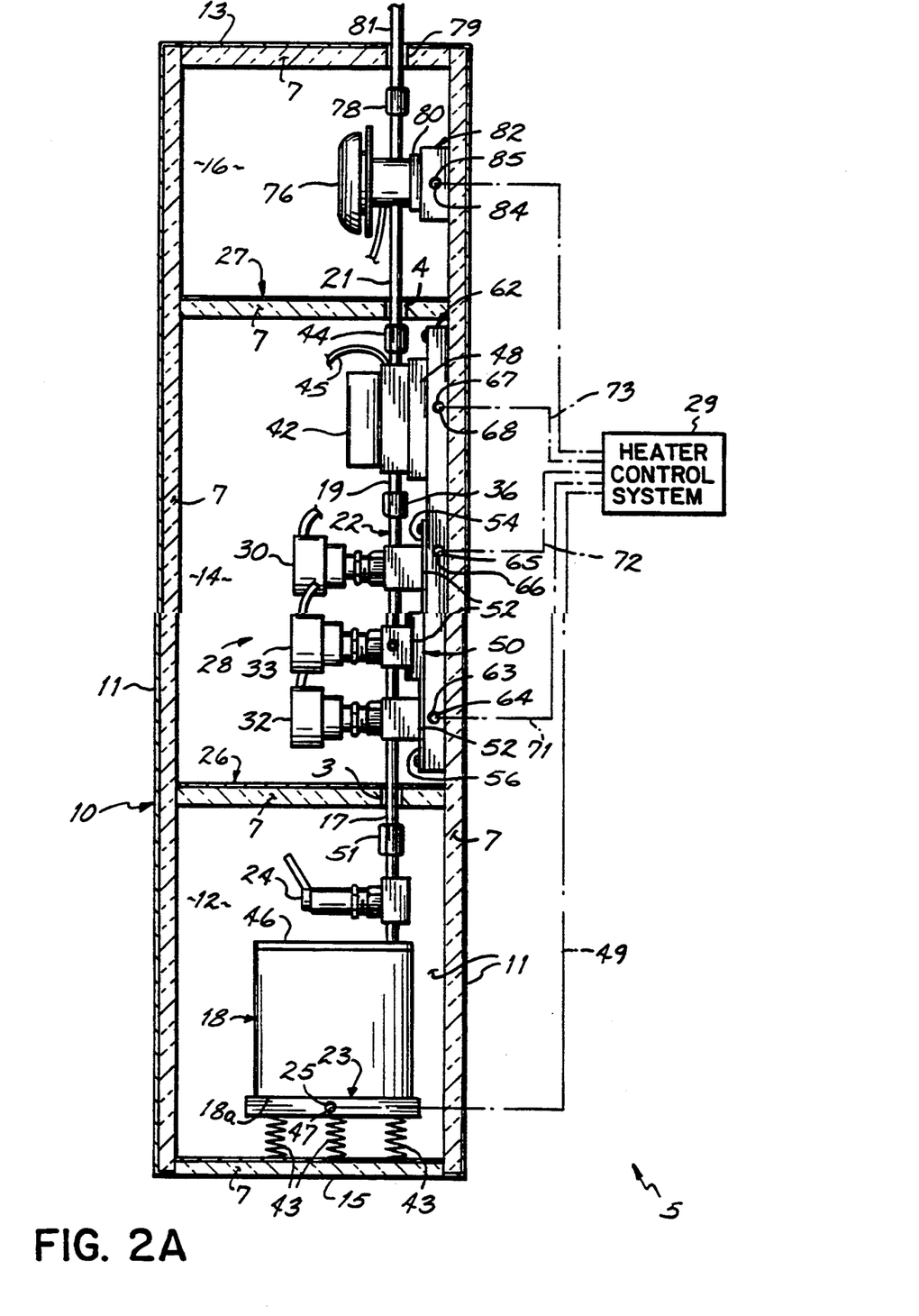
FIG. 2A is a side cross-sectional view of the reactant gas delivery system of the present invention.
Figure 2B:
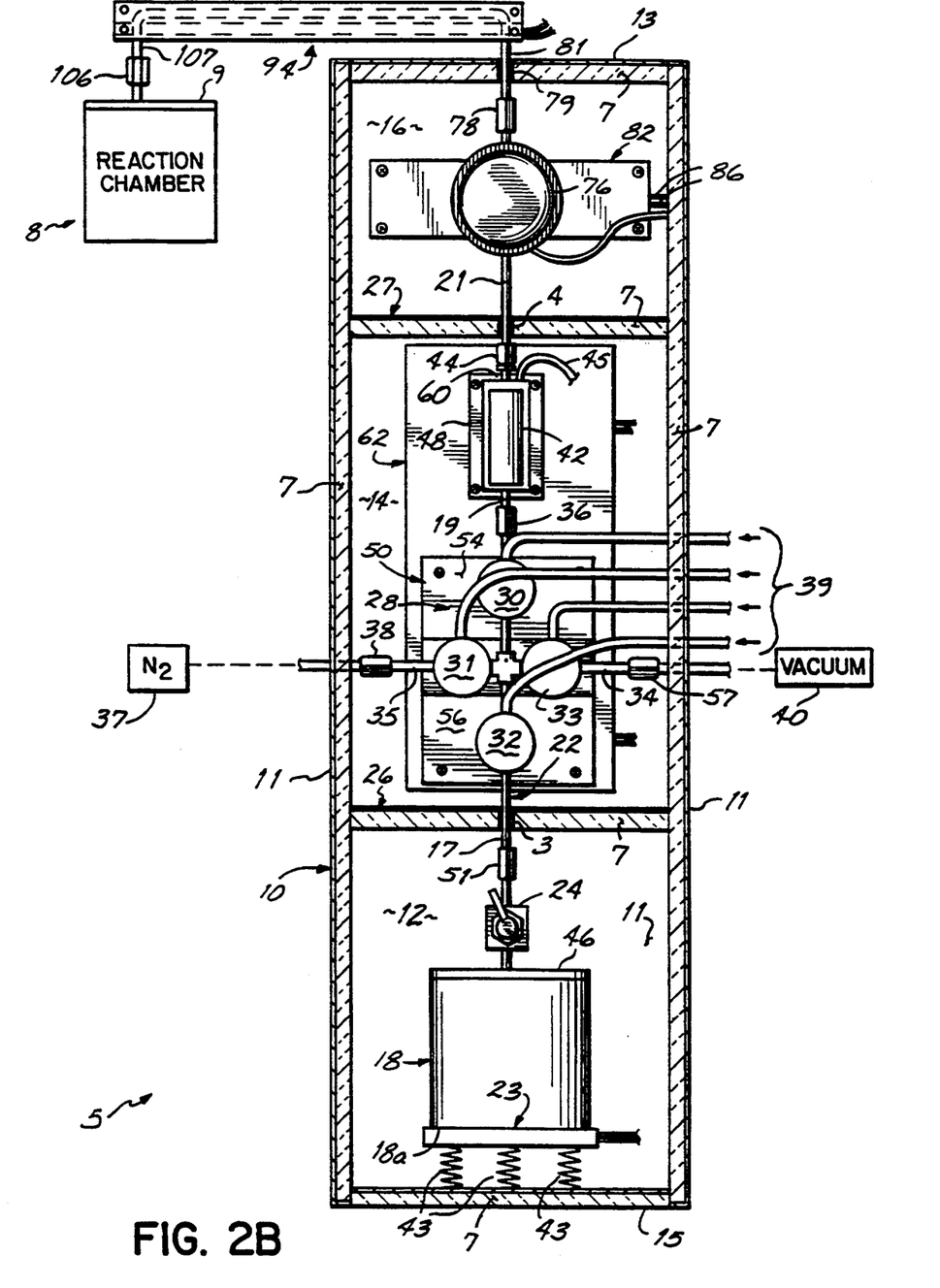
FIG. 2B is a front view, in partial cross-section, of the reactant gas delivery system of the present invention.

Referring now to FIGS. 2A and 2B, the first thermal zone 12 houses the reactant gas source 6. An ampule 18 of liquified gas 20, such as TiCl$_4$ is placed within thermal zone 12. Ampule 18 is mounted to a gas delivery line 22 at its top 46 and is thereby suspended within thermal zone 12 by line 22. A generally flat heater plate 23, preferably made of aluminum, is secured beneath the suspended ampule 18 so that the bottom surface 18a of ampule 18 and the heater plate 23 are generally coextensive along their point of contact. Heater plate 23 is approximately 0.5 inches thick and has a heating surface which measures approximately 6 by 7 inches. As seen in greater detail in FIGS. 5A, 5B, heater plate 23 includes an elongated cylindrical bore 25 formed longitudinally within the heater plate 23. Holes 41 are drilled and tapped within heater plate 23 for support fasteners and springs 43 which bias the plate 23 against the bottom surface 18a of ampule 18. The bore 25 holds an elongated cartridge resistance heater 47 therein which is thermostatically controlled in closed-loop fashion to heat to a specific temperature which, in turn, heats plate 23. Cartridge heaters sufficient for such an application are cartridge heater Model Nos. G5A71, G12A47, G5J45 and G4E15 available from Watlow Electric Heaters and Controls of Orange, Calif.

The cartridge heater 47 is connected to a heater control system 29 by lines 49. A suitable heater control system for such a purpose is the Model 1600 available from Athena Controls, Inc. of Plymouth Meeting, Pa. A thermocouple (not shown) is coupled to the plate 23 and to system 29 to provide temperature information so that the plate 23 may be heated to the desired temperature. It is also desirable to take periodic measurements of the ampule 18 and other in-line components during operation of the present invention to ensure that plate 23 and the other heater plates discussed below are at temperatures sufficiently high to heat the components to their desired temperatures. For example, if a measurement of the temperature of ampule 18 reveals that the plate 23 is at 70° C. but the ampule is at 68° C., then it may be desirable to adjust the heater control system 29 so that plate 23, and consequently ampule 18, are hotter. Heater control system 29 is operated to heat the plate 23 which, in turn, heats the ampule 18. The coextensive contact between bottom surface 18a of ampule 18 and plate 23 ensures uniform heating of ampule 18. The ampule 18 is heated to a temperature sufficient to evaporate the liquified TiCl$_4$ 20 to form the reactant gas which flows through gas delivery line 22 before the mass flow controller 42. In a preferred embodiment, the liquified TlCl$_4$ is heated to approximately 70° C. to form a gas at a vapor pressure of approximately 100 Torr within the gas delivery line 22. A pressure of 100 Torr is a typical source pressure utilized for CVD processes in the reaction chamber 8.

Gas delivery line 22 extends vertically through housing 10 and through each thermal zone 12, 14, 16 illustrated by sections 17, 19, 21 of line 22. Within the first thermal zone 12, a manual valve 24 is connected to ampule 18 in-line with gas delivery line 22 to control the flow of the reactant gas from the ampule 18. A manual valve such as a BN Series valve available from NUPRO Company of Willoughby, Ohio, is suitable for such a purpose. Valve 24 is connected in-line with the gas delivery line 22 by a connector 51, such as a VCR metal gasket face seal fitting available from CAJON Company of Macedonia, Ohio. The heat from plate 23 within the first thermal zone 12 also heats up the insulated space defined by the first thermal zone 12 and condensation is prevented. Line section 17 in the first thermal zone 12 is approximately 4.5 inches in length. Gas delivery line 22 passes from the first thermal zone 12 to the second thermal zone 14 through opening 3 in the first divider wall 26. Wall 26 separates the first and second thermal zones 12, 14 and is insulated similarly to the housing 10 to thermally isolate the two thermal zones 12 and 14 from each other.

Within the second thermal zone 14, the gas delivery line 22 passes through a valve cross assembly or manifold 28 connected to four pneumatically controlled valves 30, 31, 32, 33 arranged in a cross formation with sections of line 34, 35 extending generally perpendicular to gas delivery line 22. The flow of reactant gas through the valve cross manifold 28 of the second thermal zone 14 is determined by valves 30, 32 which are connected in-line by connectors 36 and 51, respectively. Valve 31 couples a nitrogen (N$_2$) gas supply 37 into the valve cross manifold 28 through connector 38 while valve 33 couples a vacuum system 40 into valve cross manifold 28 through connector 57. A pneumatic valve suitable for valves 30, 31, 32, 33 is a BN Series pneumatic valve from NUPRO Company of Willoughby, Ohio. The valves 30, 31, 32, 33 are controlled by the appropriate air lines 39 connected to a pneumatic controller (not shown).

The vacuum system 40 is coupled to valve cross manifold 28 by valve 33 to purge the manifold 28 and the section of gas delivery line 22 in first thermal zone 12 of reactant gas whenever the ampule 18 is changed or the supply of liquid TiCl$_4$20 is replaced. The supply of nitrogen 37, on the other hand, is used to purge the mass flow controller 42 and the remaining section of gas delivery line 22 extending from cross manifold 28 to the reaction chamber 8. The nitrogen removes remnant reactant gases remaining in the line 22. That is, the vacuum system 40 purges the section of line 22 from the cross manifold 28 to the ampule 18, while the nitrogen supply 37 purges the section of line 22 from the manifold 28 to the reaction chamber 8. Connectors 36, 38 and 57 are similar to VCR connector 51.

Above cross manifold 28, within the second thermal zone 14, is a mass flow controller 42 which measures the flow rate of reactant gas which passes through the gas delivery line 22. The mass flow controller 42 is connected in-line with VCR connector 44 similar to connector 51, and is controlled by line 45 which is coupled to a suitable flow rate control mechanism (not shown). A suitable mass flow controller 42 for the purpose of this invention is Model SEC-3400SH (100 sccm TICl$_4$) mass flow controller available from STEC Instruments, Inc. of Sunnyvale, Calif. The mass flow controller 42 requires a pressure drop of approximately 50 Torr. Therefore, the 100 Torr pressure inside line 22 before the mass flow controller 42 is reduced to approximately 50 Torr at the outlet 60 of the controller 42. The input gas pressure to reaction chamber 8 is controlled downstream of the chamber 8 by a throttle valve (not shown) which is connected to a vacuum system and may be adjusted to vary the input pressure. The throttle valve may be adjusted to vary the chamber input pressure from 1–50 Torr and is set to preferably approximately 20 Torr.

Figures 7, 8:
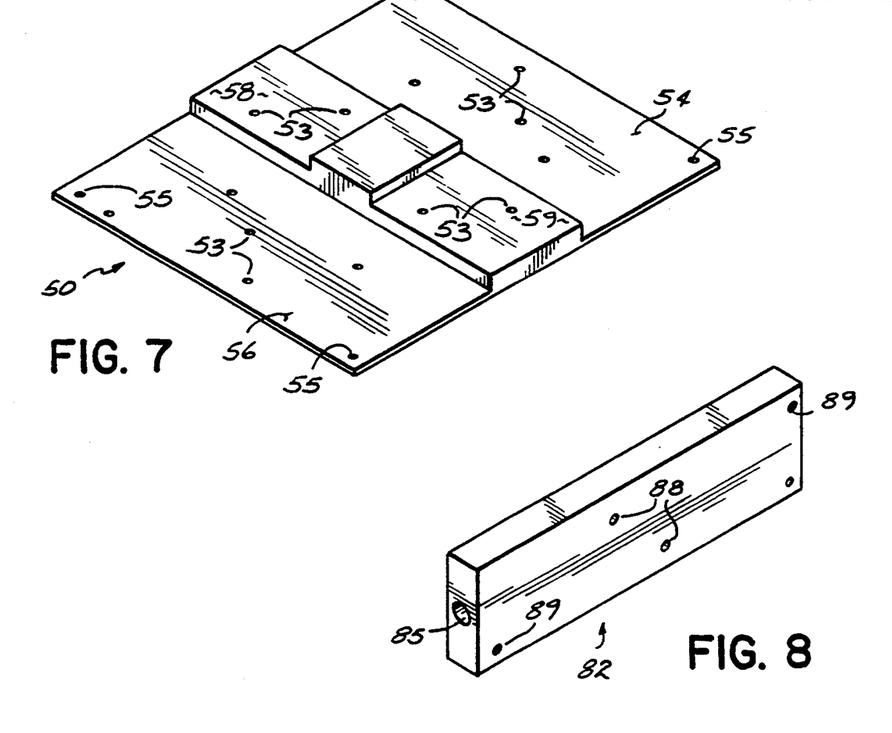
FIG. 7 is a perspective view of a valve cross mounting plate used within the second thermal zone.
FIG. 8 is a perspective view of the heater plate of the third thermal zone.

In accordance with the present invention and as shown in FIGS. 2A and 2B, the mass flow controller 42 and valves 30, 31, 32 and 33 are connected to steel mounting plates 48 and 50, respectively. Appropriate valves such as the BN-series and B-series valves from NUPRO Company each have a flat bottom surface 52 which is mounted to flat surfaces on mounting plate 50. FIG. 7 illustrates mounting plate 50 in more detail. Plate 50 is rectangular and has opposing flat surfaces 54, 56 for the upper and lower valves 30, 32, respectively. The plate 50 also has opposing flat surfaces 58, 59 which are raised above surfaces 54, 56. The surfaces 54, 56, 58 and 59 are arranged in a cross formation as shown in FIG. 7 to adapt to valve cross 28. Valves 31, 33 are mounted to surfaces 58, 59, respectively. The flat surfaces 54, 56, 58, 59 of plate 50 are coextensive with the bottom surfaces 52 of valves 30, 31, 32, 33 to ensure proper contact and to provide efficient heat conductivity. Holes 53 are drilled within mounting plate 50 to mount the valves 30, 31, 32, 33 to mounting plate 50. Further, holes 55 are drilled within plate 50 to mount plate 50 to a heater plate 62.

Figures 5A, 5B, 6A, 6B:
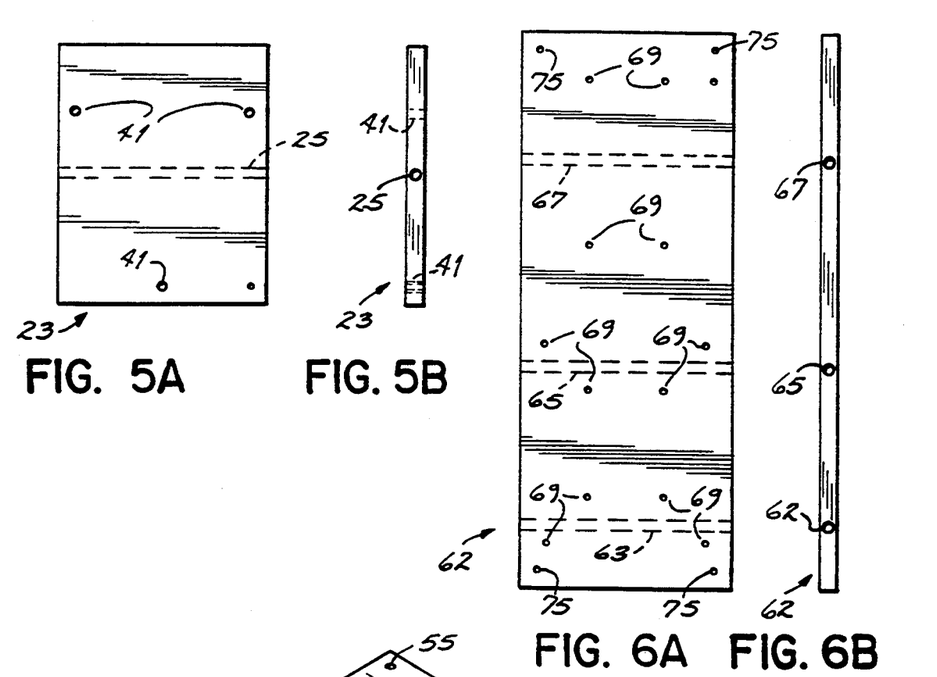
FIGS. 5A and 5B are front and side views, respectively, of the heater plate of the first thermal zone of the invention.
FIGS. 6A and 6B are front and side views, respectively, of the heater plate of the second thermal zone.

The mass flow controller 42 is mounted to rectangular steel plate 48. The mounting plates 48 and 50 are mounted flat against the second heater plate 62 in the second thermal zone 14. As shown in detail in FIGS. 6A and 6B, heater plate 62 is approximately 6 by 15.5 inches. The heater plate 62 is preferably made of aluminum approximately 0.5 inches thick. The heater plate 62 includes longitudinal bores 63, 65, 67 for three cartridge heaters 64, 66, 68, respectively, similar to the cartridge heater 47 of heater plate 23 in the first thermal zone 12. The cartridge heaters 64, 66, 68 heat aluminum heater plate 62 throughout. Each heater 64, 66, 68 of heater plate 62 is close-loop controlled by heater control system 29 which is coupled to each of the cartridge heaters by lines 71, 72, 73, respectively. Further, thermocouples (not shown) are coupled to plate 62 and relay temperature information from the plate to system 29. It is desirable to utilize a thermocouple for each cartridge heater to heat the individual cartridges independently depending upon the heat absorption characteristics of the components mounted to plate 62. Heater plate 62, in turn, uniformly conductively heats mounting plates 48 and 50 to uniformly conductively heat valves 30, 31, 32, 33 and mass flow controller 42, which heat reactant gas passing therethrough. The plate heater 62 also heats the air in the insulated thermal zone 14 to thereby heat the gas delivery line 22 by air convection. As shown in FIG. 6A, heater plate 62 includes holes 69 for mounting the mounting plates 48, 50 to heater plate 62, and has holes 75 for mounting heater plate 62 to housing 10 such as with screws or bolts.

In a preferred embodiment of the system 5 utilized to deliver TiCl$_4$ to a reaction chamber 8, the heater plate 62 is heated to approximately 80° C. Therefore, the temperature of the second thermal zone 14 is greater than the temperature of the first thermal zone 12 which is preferably around 70° C. By utilizing progressively higher temperatures along the gas delivery line 22, cool spots along line 22 where the vaporized gas might condense are eliminated. Thereby, condensation is prevented ensuring uniform flow of the reactant gas as well as proper operation of the mass flow controller 42. The line section 19 extending through the second thermal zone has a length of approximately 16.5 inches.

The gas delivery line 22 extends from mass flow controller 42 and through the divider wall 27 and opening 4 into the third thermal zone 16. A pneumatic valve 76 and VCR connector 78 are connected in-line within the third thermal zone 16. Connector 78 is similar to connector 51. Pneumatic valve 76 can be a B-Series valve from NUPRO Company of Willoughby, Ohio. Wall 27 separates the second thermal zone 14 from the third thermal zone 16 and is also insulated like wall 26 to thermally isolate the two thermal zones 14, 16. Valve 76 is secured to a mounting plate 80 which is mounted to a heater plate 82. As shown in FIG. 8, heater plate 82 is approximately 1.5 by 5.5 inches and preferably made of approximately 0.5 inch aluminum. The heater plate 82 includes an elongated cartridge heater 84 which extends through a longitudinal bore 85 in the heater plate 82, and which is similar to cartridge heaters 47, 64, 66 and 68 within the first and second thermal zones 12, 14. Cartridge heater 84 is coupled to heater control system 29 by wires 86, and control system 29 controls the temperature of the third thermal zone 16. Heater plate 82 includes holes 88 for attaching valve 76 and mounting plate 80 to the heater plate 82 and holes 89 for mounting heater plate 82 to the housing 10 such as with screws or bolts.

The third thermal zone components and reactant gas are heated at a higher temperature than the components and the reactant gas in the first and second thermal zones 12, 14. The higher temperature of the third thermal zone 16 further prevents cool spots in gas delivery line 22 and prevents condensation in the line. In the preferred TiCl$_4$ delivery embodiment of the invention disclosed herein, the temperature of the third thermal zone 16 is substantially higher than that of either the first or second thermal zones 12, 14, and is preferably around 150° C. The temperature for the third thermal zone 16 is chosen to be around 150° C. to prevent an adduct from forming within the gas delivery line 22. Therefore, the heater 84 of heater plate 82 is controlled to heat plate 82 to approximately 150° C.

More specifically, $TiCl_4$ is often utilized within reaction chamber 8 with ammonia gas ($NH_3$) in order to deposit titanium-containing layers within reaction chamber 8. Depending upon the reaction process parameters in chamber 8, some of the ammonia gas might be drawn back into the $TiCl_4$ gas delivery line 22 and may proceed through the line 22 back to the line section 21 within the third thermal zone 16. The reaction product of $NH_3$ and $TiCl_4$ is a yellow powdery adduct which forms within the line 22 and coats the walls of the line. Such an adduct hinders the uniform flow of $TiCl_4$ and also presents contaminants within the reaction chamber 8. By maintaining the section of line 22 within the third thermal zone at 150° C. or above, the formation of the adduct is prevented. While approximately 150° C. or above is a preferred temperature for the third thermal zone 16 in a system for delivering $TiCl_4$, other gases supplied to reaction chamber 8 utilizing the system 5 of the present invention might utilize higher or lower temperatures, accordingly, in the third thermal zone 16. The backflow of $NH_3$ is generally confined to the sections of line 22 within the thermal zone 16 and between thermal zone 16 and reaction chamber 8. Therefore, the temperatures of the first and second thermal zones 12, 14 can remain much lower than 150° C. and at 70° C. and 80° C., respectively. The length of section 21 is approximately 6.5 inches.

The gas delivery line 22, upon exiting the top of housing 10 and the third thermal zone 16 through opening 79, extends to the reaction chamber 8 to deliver the reactant gas to the chamber 8, as shown in FIG. 2B. In prior art devices, the connecting line section 81 was generally a flexible line to allow the cover or plenum 9 of the reaction chamber 8 to be lifted off of the reaction chamber body 8. However, the flexibility of the line leads to poor temperature uniformity. The present invention utilizes a rigid gas line section 92 and an elongated heater block 94.

Figures 3A, 3B:
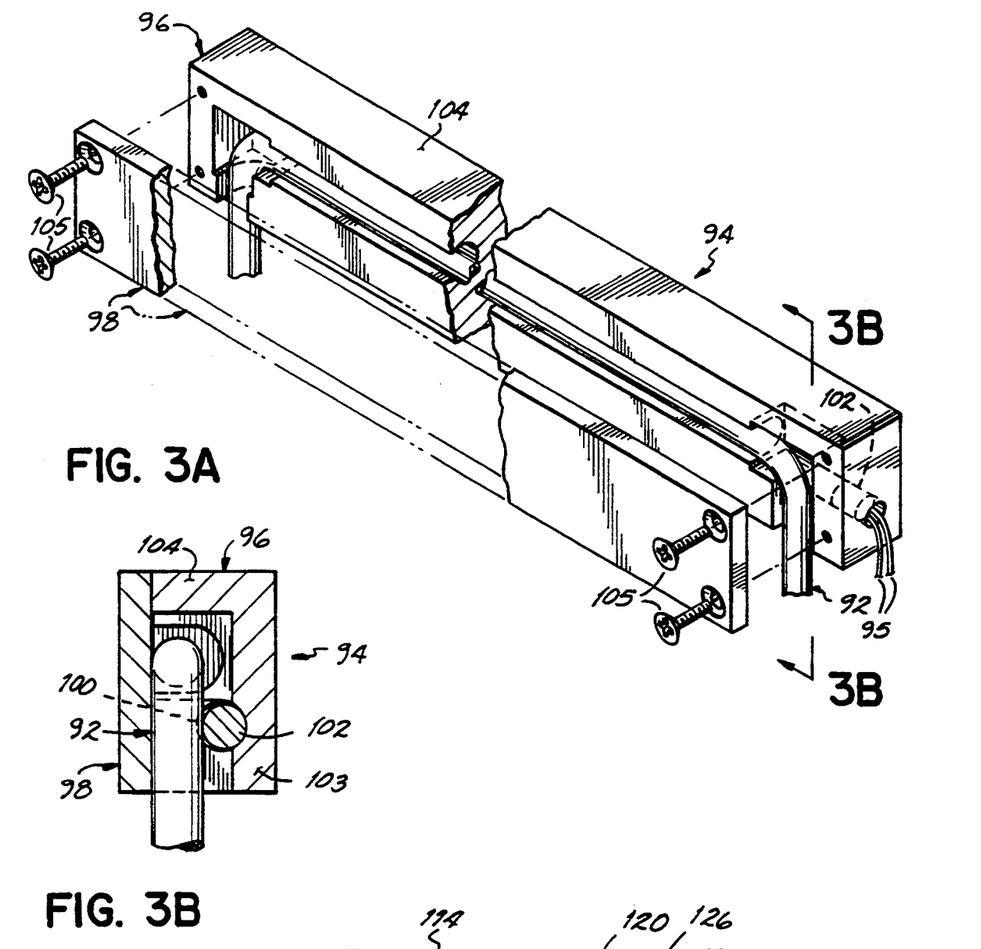
FIG. 3A is a disassembled perspective view of the heater block of the present invention which heats the gas line between the heater housing and reaction chamber.
FIG. 3B is a cross section of FIG. 3A taken along lines 3B—3B.

Heater block 94 is shown in FIGS. 3A and 3B. Heater block 94 includes a channel piece 96 which surrounds line section 92 of gas line 22 on three sides (see FIG. 3B). A plate 98 is affixed to channel piece 96 to create block 94 which completely surrounds line section 92. A longitudinal bore 100 is formed in channel piece 96 to receive a cartridge heater 102 which is similar to cartridge heater 47 and is coupled to heater control system 29 by lines 95. Cartridge heater 102 and heater control system 29 are operated to maintain heater block 94 generally from around 150° C. to 200° C. and preferably around 175° C. The thickness of side wall 103 is approximately 0.4 inches, while the thickness of top wall 104 is approximately 0.3 inches. Plate 98 is approximately 0.25 inches thick. Plate 98 is attached to channel piece 96 by screws 105 or other appropriate fasteners. The line section 92 runs generally parallel with cartridge heater 102 generally along the length of block 94 to provide uniform heating of the section 92. The block heater 94 further prevents condensation in the line 22 and prevents formation of an adduct in the line 22 should $TiCl_4$ and $NH_3$ backflow from reaction chamber 8 to line section 92. The length of line section 92 is approximately 15.87 inches.

Line section 92 exits housing block heater 94 and is coupled to cover 9 of the reaction chamber 8 so that the reactant gas may be delivered into the reaction chamber 8. In the embodiment of the present invention illustrated in FIGS. 1, 2A and 2B, i.e., the embodiment using heater block 94, the line section 92, extending through block 94, is connected to cover 9 with a short piping section 107 utilizing a quick release connective structure such as an Ultra-Torr ™ fitting 106 from the CAJON Company of Macedonia, Ohio. When the cover 9 of the chamber 8 has to be removed or moved to an open position to allow access inside the chamber 8, the fitting 106 is disconnected and cover 9 may be moved away from the chamber 8. With the cover 9 replaced in its sealing position on chamber 8, the line section 92 may be readily and quickly connected by fitting 106. The length of piping section 107 is approximately 3.5 inches.

Figure 4:
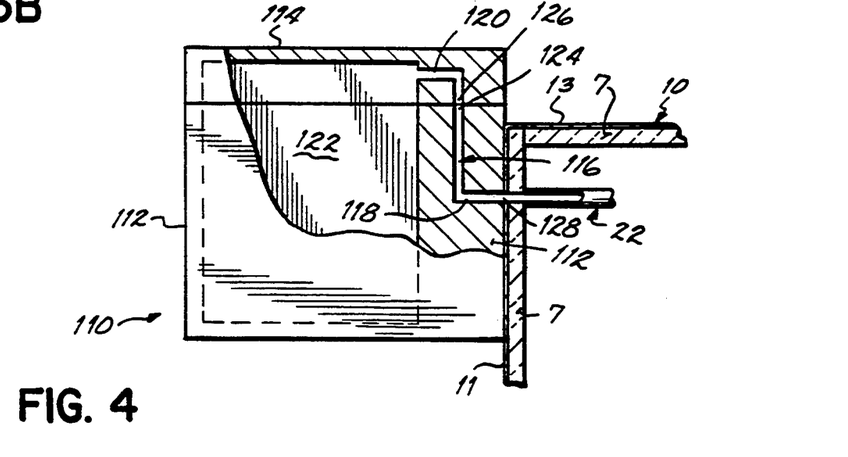
FIG. 4 is a partial cross-sectional view of a reaction chamber including a gas passage formed within and accordance with the present invention.

An alternative embodiment of the present invention eliminates the rigid pipe line section 92 and heater block 94. Specifically, as illustrated in FIG. 4, a reaction chamber 110 has sidewalls 112 and a top cover or plenum 114. One suitable material for chamber 110 is 6061-T6 aluminum which is preferably covered with electroless nickel plating. A gas passage 116 is integrally formed within one sidewall 112 and the cover 114 of the reaction chamber 110. Gas passage 116 includes a generally L-shaped wall passage 118 which extends into sidewall 112 and connects at one end to gas delivery line 22 from heater housing 10. Passage 118 bends at approximately 90° to extend generally vertically along the sidewall 112. A second L-shaped gas passage portion 120 extends through the reaction chamber cover 114 and makes a 90° bend to extend into the internal reaction space 122 of the reaction chamber 110. When cover 114 is placed on top of the reaction chamber 110, an outlet end 124 of passage 118 matches up with an inlet end 126 of the cover passage 120 to form a continuous gas passage 116 from the outside of chamber 110 to reaction space 122. In the embodiment of FIG. 4, the reaction chamber sidewalls 112 and cover 114 are heated from approximately 150° C. to 200° C. and preferably around 175° C. in the region of gas passage 116 to prevent condensation and formation of an adduct in the passage 116. The walls and cover proximate the gas passage 116 preferably include bores (not shown) which hold cartridge heaters (also not shown) similar to cartridge heater 47, for heating the reaction chamber 110 and passage 116. The cartridge heaters would be controlled by system 29 as discussed above.

The embodiment of the invention in FIG. 4 results in direct connection of the gas delivery line 22 from the heater housing 10 to the reaction space 122. The section of the gas delivery line 22 which extends through the third thermal zone 16 and out of housing 10 is coupled directly to an inlet end 128 of the gas passage 116. The embodiment of FIG. 4 eliminates heater block 94, as well as eliminating the problematic traditional flexible connection line. Cover 114 may be removed from the top of reaction chamber 110 without disconnecting the gas delivery line between the heater housing 10 and the reaction chamber 110. Cover 114 is therefore simply raised and lowered with respect to reaction chamber 110 without disconnecting a component within the gas delivery line 22. When cover 114 is lifted, the continuous gas passage comprising passage portions 118 and 120 are separated. Lowering the cover 114 onto reaction chamber 110 again joins passages 118 and 120 to present a continuous gas passage 116.

While the present invention has been illustrated by the description of embodiments thereof, and while the embodiments have been described in considerable detail, it is not the intention of Applicants to restrict or in any way limit the scope of the appended claims to such detail. Additional advantages and modifications will readily appear to those skilled in the art. For example, the specific temperatures of the various thermal zones might be varied from the preferred embodiment disclosed herein of a material other than TiCl4 is vaporized. Furthermore, the heater plates and mounting plate shapes might be altered to mount different in-line components. The invention in its broader aspects is therefore not limited to the specific details, representative apparatus and method, and illustrative example shown and described. Accordingly, departures may be made from such details without departing from the spirit or scope of Applicants' general inventive concept.

What is claimed is:

1. A gas delivery system for delivering reactant gas from a reactant gas source to a reaction chamber comprising:
   a housing having thermally-insulative walls which are separated into sections thermally isolated with respect to each other to define first, second and third thermal zones;
   a gas delivery line extending through the thermal zones of the housing between said gas source and said reaction chamber, said line having first, second and third sections located in said first, second and third thermal zones, respectively;
   a first heater coupled to the first thermal zone, the first heater operable to heat to a first temperature said first section of the gas line extending through the first thermal zone;
   a second heater coupled to the second thermal zone, the second heater operable to heat to a second temperature greater than said first temperature the second gas line section extending through the second thermal zone;
   a third heater coupled to the third thermal zone, the third heater operable to heat to a third temperature greater than said first and second temperature the third gas line section extending through said third thermal zone;
   the gas line extending progressively through each of the first, second and third thermal zones directly from the source to the reaction chamber without returning to a previous thermal zone, thereby maintaining the reactant gas at progressively higher temperature to effectively prevent condensation in the gas line and provide uninterrupted reactant gas flow to the reaction chamber.

2. The gas delivery system of claim 1, the gas line including at least one in-line component connected in line in said second gas line section through which reactant gas flows, the second heater operable to heat said component to the second temperature.

3. The gas delivery system of claim 1 wherein the gas line includes at least one component connected in line in said third gas line section through which reactant gas flows, the third heater operable to heat said component to the third temperature.

4. The gas delivery system of claim 1 wherein said first temperature is in a range of approximately 65° C. to 75° C.

5. The gas delivery system of claim 1 wherein said second temperature is in a range of approximately 75° C. to 90° C.

6. The gas delivery system of claim 1 wherein said third temperature is in a range of approximately 100° C. to 175° C.

7. The gas delivery system of claim 1 wherein at least one of said first, second and third heaters includes a heater which is in conductive thermal contact with said gas line section in the respective thermal zone and conductively heats said gas line section.

8. The gas delivery system of claim 1 further comprising a heating block located between the reaction chamber and said housing, said heating block configured to receive a further section of the gas delivery line which extends from said housing to the reaction chamber and operable to heat said further section of said gas line to a specific temperature.

9. The gas delivery system of claim 8, wherein said specific temperature is in a range of approximately 150° C. to 200° C.

10. The gas delivery system of claim 1, wherein said first heater includes a heated plate supportingly contacting a metal container of liquified reactant material, the plate being in thermally conductive contact with said container and operable to conductively heat said container to said first temperature to vaporize liquified reactant material in said container to form a gas such that reactant gas flows through said gas delivery line.

11. The gas delivery system of claim 1 wherein the gas delivery line includes at least one component connected in line in one of said second and third line sections, the component being secured to a mounting plate which is thermally conductively mounted to a heater in one of said second and third thermal zones such that the component is conductively heated through said mounting plate.

12. The gas delivery system of claim 11 wherein the component is selected from the group of a valve, a mass flow controller and a connector.

13. The gas delivery system of claim 7 wherein said heater comprises a heated aluminum plate in thermal conductive contact with the gas line section to accurately and efficiently heat the gas line section.

14. The gas delivery system of claim 10 wherein said heated plate is formed of aluminum.

15. The gas delivery system of claim 11 wherein said heater comprises a heated aluminum plate in thermal conductive contact with the mounting plate and component to accurately and efficiently heat the gas line section.

16. The gas delivery system of claim 1 further comprising a reactant gas source, said source containing a titanium tetrahalide.

17. A gas delivery system for vaporizing a liquified reactant material into a gas and delivering said reactant gas to a reaction chamber comprising:
   a housing having thermally-insulative walls which is separated into first and second thermal zones thermally isolated with respect to each other, the first zone including a metal reservoir for containing said liquified reactant material and a heated plate to contact said reservoir and conductively heat the reservoir to a first temperature sufficient to vaporize said liquified reactant material into a reactant gas;
   a gas delivery line coupled to said reservoir to transport the reactant gas through the first and second thermal zones of the housing said line having first and second sections located in said first and second thermal zones, respectively, the gas delivery line including at least one component connected in line in said gas delivery line second section in the second thermal zone;

a heater positioned in said second thermal zone, said component mounted in conductive thermal contact with said heater such that the heater accurately and efficiently conductively heats said component and said gas line to a second temperature higher than said first temperature;

the gas line extending progressively through each of the first and second thermal zones directly from said reservoir to the reaction chamber without returning to a previous thermal zone thereby maintaining the reactant gas at progressively high temperatures to effectively prevent condensation in the gas line and provide uninterrupted gas flow.

18. The gas delivery system of claim 17 wherein the housing is further separated to include a third thermal zone located between the second thermal zone and the reaction chamber, a heater positioned in the third thermal zone, the gas delivery line having a third section extending through said third zone and including at least one other component connected in line in said third gas line section in the third thermal zone, said one other component being mounted in conductive thermal contact with said third thermal zone heater such that the heater accurately and efficiently conductively heats said one other component to a third temperature higher than said second temperature.

19. The gas delivery system of claim 18 wherein the gas delivery line includes a further section extending out of said housing to connect to the reaction chamber, the system further comprising a rigid heating block which is configured to contain said further section and operative to conductively heat the further section at a specific temperature higher than said third temperature.

20. The gas delivery system of claim 17 wherein said liquified reactant material is a titanium tetrahalide.

21. A heating system for heating a reactant gas delivery line which contains a plurality of in-line components and extends between an upstream reactant gas source and a downstream reaction chamber, the heating system comprising:

a first contact heater plate heated to a first temperature;

a second contact heater plate heated to a second temperature higher than said first temperature and positioned downstream from said first contact heating plate along the gas delivery line;

a first component connected in line in a first section of the gas delivery line, the first component mounted in conductive thermal contact with said first contact heater plate to be accurately and efficiently heated at said first temperature; and a second component connected in line in a second section of the gas delivery line located downstream from said first component and said first section, the second component mounted in conductive thermal contact with said second contact heater plate to be accurately and efficiently heated at said second temperature to prevent condensation of the gas as it travels from the source to the reaction chamber.

22. The heating system of claim 21 further comprising an insulated housing which surrounds said first and second contact heater plates to contain the heat generated by said plates and confine the heat around the gas delivery line to more efficiently heat the gas delivery line.

23. The heating system of claim 22 wherein at least one of said contact heater plates is formed of aluminum.

24. A chemical vapor deposition system for depositing films onto a substrate using reactant gases from a reactant gas source comprising:

a reaction chamber including a housing defining a reaction space;

a gas delivery line for coupling a reactant gas source to the reaction chamber to deliver reactant gas to the reaction space;

The reaction chamber having a reactant gas passage formed integrally within a well of the housing, the gas passage embedded within said wall and including an inlet formed in an outside surface of said housing end configured to connect to the gas delivery line and a gas outlet formed in an inside surface of said housing proximate the reaction space to deliver reactant gas to the reaction space.

25. The chemical vapor deposition system of claim 24 further comprising:

a heater housing for heating a portion of the gas delivery line and the reactant gas prior to introducing the gas to said reactant gas passage, the housing being separated into a plurality of successive thermally isolated thermal zones which have progressively higher temperatures, the gas line extending through the thermal zones and the heater housing operable to heat successive sections of the line at said progressively higher temperatures between the source and the reaction chamber.

26. The gas delivery system of claim 25 wherein at least one of said thermal zones includes a contact heater that contacts a section of the gas line within the respective thermal zone to conductively heat the gas line section and reactant gas.

27. The chemical vapor deposition system of claim 24 wherein the reaction chamber housing includes a cover movable between an open and closed position relative to said reaction space, said reactant gas passage comprising a first portion integrally formed within a section of said wall of the housing and defining said inlet and a second portion integrally formed within said cover and defining said outlet, the first and second portions being aligned to form a continuous reactant gas passage from inlet to outlet when said cover is moved to said closed position.

28. A method of delivering reactant gas to a reaction chamber from a reactant gas source comprising:

coupling a gas line between a source of reactant gas and a reaction chamber to carry reactant gas from the source to the chamber;

passing said gas line from the source through a housing separated into a plurality of successive thermally isolated thermal zones;

heating successive sections of the gas line to progressively higher temperatures in the successive thermal zones: and extending the gas line through each progressively higher temperature thermal zone from the source to the chamber without returning to a previous thermal zone such that successive sections of the gas line are heated at progressively higher temperatures than previous sections to effectively prevent condensation of the reactant gas in the gas line.

29. The method of claim 28 wherein the reactant gas source includes a source of reactant material in liquified form, the method further comprising heating the source of liquified reactant material in a first thermal zone within a thermally isolated housing to vaporize the material and form a reactant gas in the line.

30. The method of claim 28 wherein the step of heating the successive sections of gas line in the thermal zones comprises placing one section of the gas line in conductive thermal contact with a heater positioned in at least one of the thermal zones and heating said heater to a temperature such that the heater conductively heats said line section.

31. The method of claim 28 further comprising:
coupling an external section of the gas line extending between the housing and the reaction chamber to a rigid heater block to prevent flexing of the line; and
heating the rigid heater block to a temperature such that the block conductively heats the external gas line section to further prevent condensation in the gas line and to effectively prevent an adduct from forming in the line.

32. The method of claim 28 wherein the housing includes at least first, second and third thermally isolated thermal zones, the method further comprising heating the line section in the first thermal zone in a range of approximately 65° C. to 75° C.

33. The method of claim 32 further comprising heating the line section in the second thermal zone in a range of approximately 75° C. to 90° C.

34. The method of claim 32 further comprising heating the line section in the third thermal zone in a range of approximately 100° C. to 175° C.

35. The method of claim 31 wherein said temperature is in a range of approximately 150° C. to 200° C.

36. The method of claim 28 further comprising passing reactant gas through a gas passage integrally formed within a wall of the reaction chamber and connected to said gas line.

37. The method of claim 36 further comprising heating said reaction chamber to heat said wall and said integrally formed gas passage and prevent condensation of the reactant gas within the passage.

* * * * *

UNITED STATES PATENT AND TRADEMARK OFFICE
CERTIFICATE OF CORRECTION

PATENT NO.   : 5,451,258

DATED        : Sep. 19, 1995

INVENTOR(S)  : Hillman et al.

It is certified that error appears in the above-identified patent and that said Letters Patent is hereby corrected as shown below:

Column 10, line 9, please delete the words and symbol "Ultra-TORR™" and insert --Ultra-TORR®--.

Column 14, line 15, please delete the word "well" and insert --wall--.

Column 14, line 19, please delete the word "end" and insert --and--.

Signed and Sealed this

Thirteenth Day of August, 1996

Attest:

BRUCE LEHMAN

Attesting Officer    Commissioner of Patents and Trademarks